United States Patent [19]

Iversen

[11] Patent Number: 5,111,280
[45] Date of Patent: May 5, 1992

[54] THERMAL MANAGEMENT OF POWER CONDITIONING SYSTEMS

[76] Inventor: Arthur H. Iversen, 15315 Sobey Rd., Saratoga, Calif. 95070

[21] Appl. No.: 517,222

[22] Filed: May 1, 1990

Related U.S. Application Data

[63] Continuation-in-part of Ser. No. 269,882, Nov. 10, 1988, Pat. No. 4,989,070.

[51] Int. Cl.$^5$ .................. H01L 25/04; H01L 39/02; H01L 23/02
[52] U.S. Cl. ........................... 357/82; 357/80; 357/81; 361/385; 165/80.4
[58] Field of Search .................. 357/82, 80, 81; 361/385; 165/80.4, 133

[56] References Cited

U.S. PATENT DOCUMENTS 4,712,609 12/1987 Iversen ..................... 165/80.4
4,774,630 9/1988 Reisman et al. ............ 361/383
4,799,543 1/1989 Iversen et al. ............. 165/135

Primary Examiner—Rolf Hille
Assistant Examiner—David Ostrowski
Attorney, Agent, or Firm—Streich Lang

[57] ABSTRACT

A semi-conductor assembly including an elongated electrically conductive support structure defining a sinuous coolant flow path between respective upper and lower surfaces of the support structure. The sinuous coolant path includes alternating concave and convex coolant surfaces. A first series of semi-conductor devices is secured in a thermally intimate manner to the upper surface of the support structure, and a second series of semi-conductor devices is secured in a thermally intimate manner to the lower surface of the support structure. Each semi-conductor device is disposed proximate a concave curved surface of the coolant path.

14 Claims, 4 Drawing Sheets

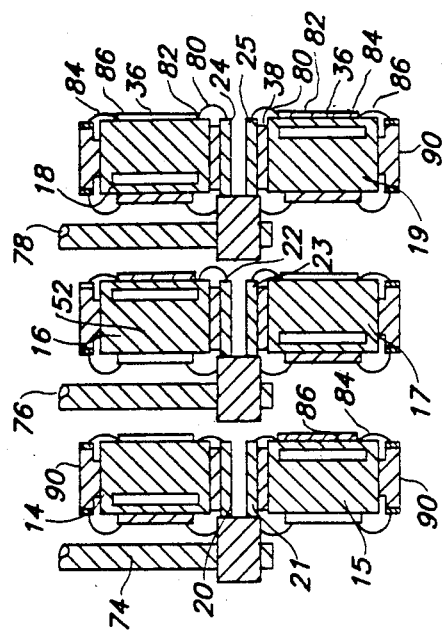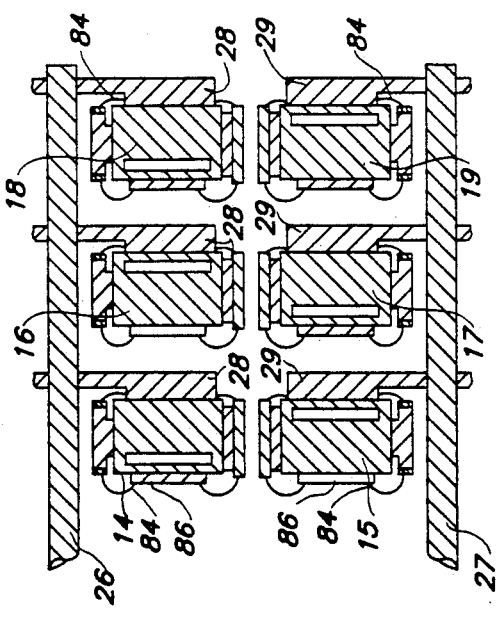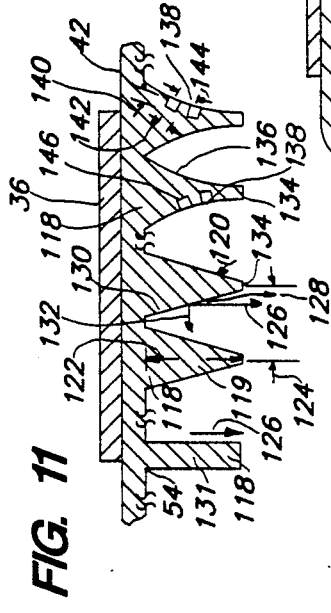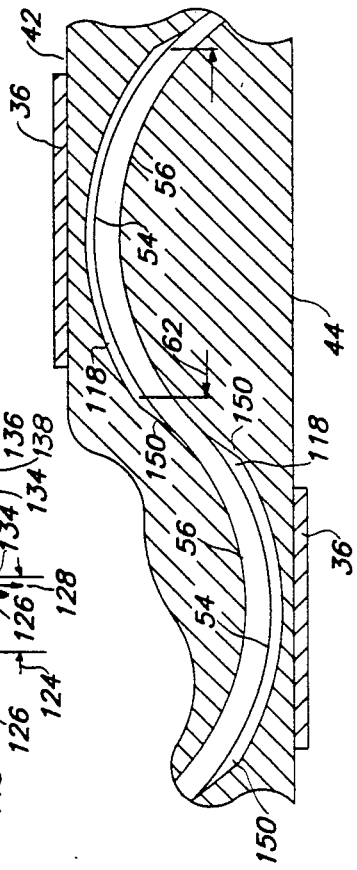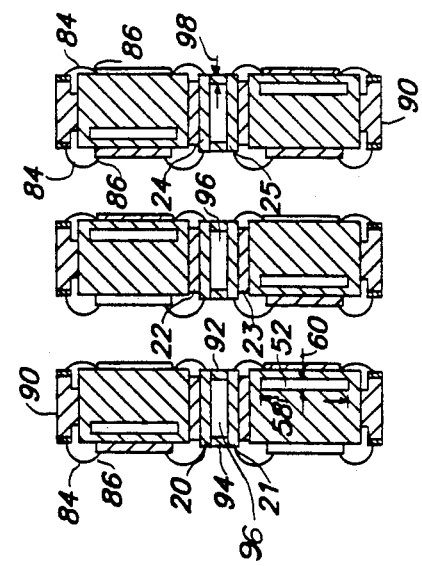

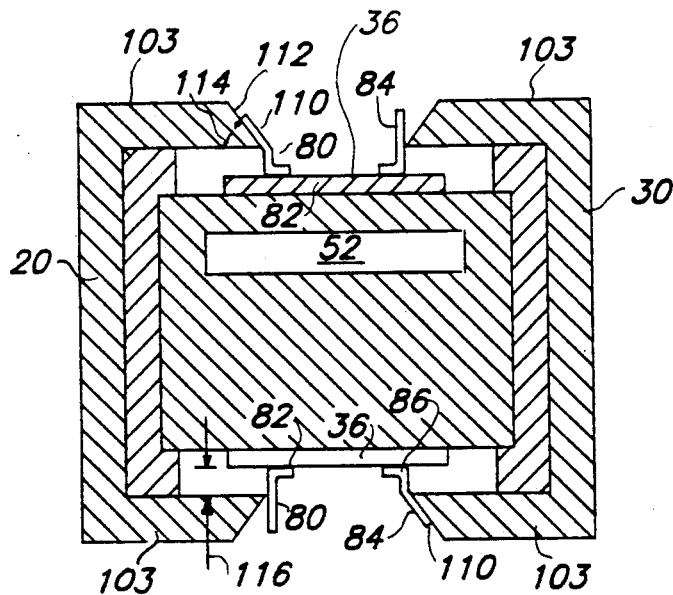
FIG. 7
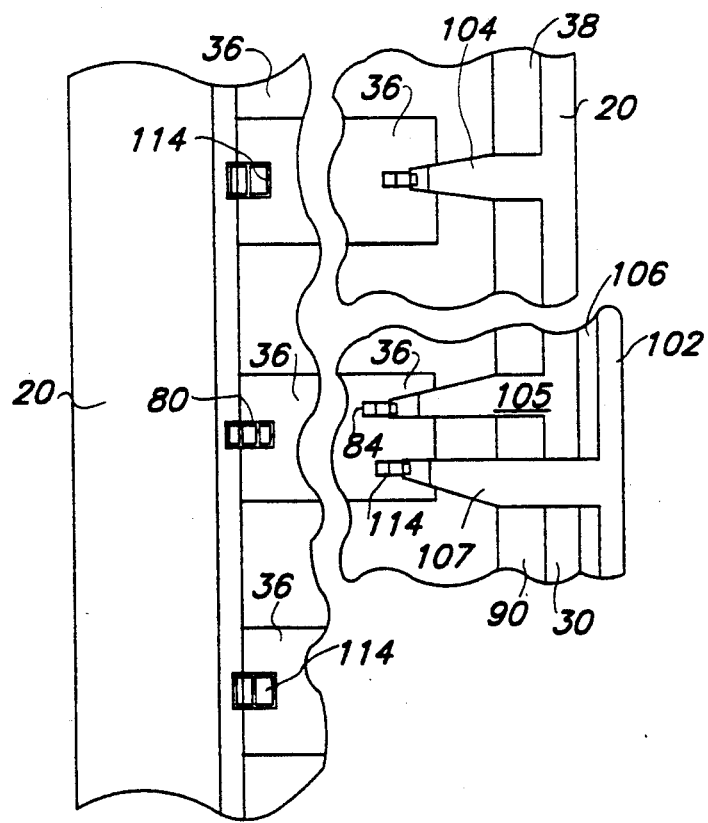
FIG. 9
FIG. 10
FIG. 8

THERMAL MANAGEMENT OF POWER CONDITIONING SYSTEMS

This is a continuation-in-part of application Ser. No. 07/269,882 filed on Nov. 10, 1988, now U.S. Pat. No. 4,989,070 issued on Jan. 29, 1991.

TECHNICAL FIELD

The present invention relates to boiling heat transfer and particularly concerns means for the efficient cooling of power semiconductor devices.

BACKGROUND OF THE INVENTION

The need for more efficient heat removal from semiconductor devices has become more important as design rules for IC's shrink and power levels of power devices such as diodes, FET's and thyristors increase. As device power and packaging densities increase, high heat fluxes must be dissipated. The need exists for semiconductor heat removal structures that can handle higher heat fluxes, are more compact and less costly.

SUMMARY OF THE INVENTION

The present invention provides for an electrically isolated semiconductor heat sink that permits multiple devices to be conveniently mounted on a single structure.

The present invention provides for a heat sink that may be readily removed and replaced.

The present invention provides for a boiling heat transfer surface wherein temperature overshoot may be minimized.

The present invention provides a liquid cooled semiconductor heat sink that can dissipate heat flux that is an order of magnitude greater than currently available.

The present invention provides a liquid cooled semiconductor heat sink that is smaller and lighter than high flux heat sinks currently in use.

The present invention further provides a liquid cooled semiconductor heat sink that enables efficient use of dielectric liquid coolants thereby avoiding the electrical leakage and corrosion that can result from the use of water coolant.

The present invention provides a liquid coolant semiconductor heat sink that enables substantially uniform temperature operation of semiconductor devices.

The present invention provides a liquid cooled semiconductor heat sink of efficient operation that enables the choice of coolant to be made on the basis of non-toxicity or other criteria and not on thermal efficiency considerations.

The present invention provides a liquid cooled semiconductor heat sink that operates effectively in a zero gravity environment and in a negative gravity environment.

DESCRIPTION OF THE DRAWINGS

FIG. 3 is a partial cross section view through the source, drain and gate elements to illustrate the output connections for each phase.

FIG. 4 is a partial cross section view through the drain, source and gate elements to illustrate the positive and negative input voltages to the drain elements.

FIG. 5 is a partial cross section view through the three phase inverter to illustrate the source busses with hollow conduits.

FIG. 7 is a cross section view of a single drain buss illustrating ruggedized lead bond construction.

FIG. 8 is a partial plan view of a ruggedized elongated source buss.

FIG. 9 is a partial plan view of a ruggedized gate line or source buss lead bond arm.

FIG. 10 is a partial plan view of a ruggedized multiple gate line arm.

FIG. 11 is a cross section view of the heat exchange surface prepared with fins (orthogonal) to the path of coolant flow.

FIG. 12 is a cross section view of the heat exchange surface prepared with fins (parallel) to the path of coolant flow.

Referring now to FIG. 1, shown is a cross section view of an assembly 13 to be employed as a three phase inverter. This is but one example of various classes of devices used for power conditioning as might be employed in, for example, switching regulators, switching converters, motor drivers, relay drivers etc. Other applications include single phase devices, comprising one leg instead of three phases as might be used in, for example, RF induction heating, as high power RF signal sources, e.g. FM or TV transmitters, etc. For purposes of illustration, devices employed in the description are MOSFETS, but also may be other power devices, for example, other FET's, IGBT's, MCT's, power transistors, diodes etc. The arrangement, nomenclature, geometry and electrical connections employed may vary with the type of device used and the application. The terms employed herein are used to describe an application employing MOSFETS. Other term may be employed with other types of power devices.

Referring now to FIGS. 1 and 4, three phase inverter device 13, employing MOSFETS, includes three pairs of drain busses 14 and 15, 16 and 17, and 18 and 19. Referring now to FIG. 4, drain busses 14, 16 and 18 are biased positive (+) through common electrical interconnect 26. Drain busses 15, 17 and 19 are biased negative (−) through common electrical interconnect 27. Electrical connection between positive drain busses, 14, 16, 18, are made to positive common electrical connection 27 by connectors 28. Electrical connections between negative drain busses, 15, 17, 19, and negative common electrical connection 27 are made by connectors 29.

Referring now to FIGS. 1 and 3, each drain bus, 14-19, has placed in close proximity a source bus 20, 21, 22, 23, 24 and 25 to which it may be attached to and spaced from by electrical insulators 38 which may extend the length 50 of each of the drains and sources. MOSFET device 36, preferably a chip, sometimes referred to as a bare chip, but may also be a packaged chip, is bonded at its drain 40 to drain busses 14-19, on outer surfaces 42, 44.

Referring now to FIGS. 1 and 2, drain busses 14-19 are generally rectangular in cross section of width 46, thickness 48 and length 50. Width 46 and thickness 48 are generally small compared to length 50. A sinuous coolant conduit 52 is provided in drain busses 14-19 having alternately a concave 54 and convex 56 curved surface with respect to the opposing external surfaces 42,44. Conduit 52 (FIG. 5) has a width 58 greater than its height 60 and the dimensions remain substantially constant for length 50 of drain busses 14-19, that is, the cross section of conduit 52 remains substantially constant.

Figure 2:
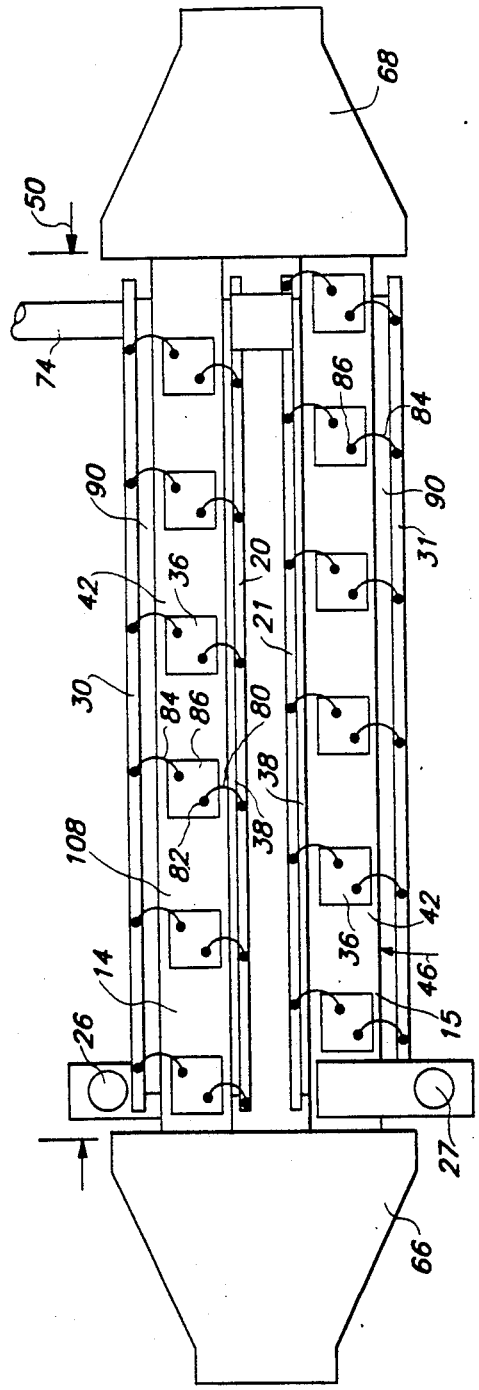
FIG. 2 is a plan view illustrating the two drain busses for each leg, one providing the positive going voltage and the other the negative going voltage.

In general, if the same devices 36 are employed, the concave 54 period length 62 (i.e. the cord length), (FIG. 1) and the convex 56 period length 43 are substantially equal. If devices of differing dimensions are used, the period lengths may be altered accordingly. Typical conduit dimensions might be, for example, a width 58 of 1.2 cm and height 60 of 0.1 cm, when using a 1 cm×1 cm device 36, and the periodicity 62,64 of the sinuous conduit surface might be 2.8 cm, i.e. 62 is 1.4 cm long and 64 is 1.4 cm long. The length 50 of drain busses, 14-19 would be determined by the number of devices 36 to be bonded to drain busses 14-19. Though only one device 36 is shown opposing concave curved surface segments 62, multiple smaller devices may be mounted. The criteria is that the high heat flux generating parts of the devices do not extend into the convex curved surface segments 64 where the heat removal characteristics are poor.

As shown in FIGS. 1, 3, 4, and 5, devices 36 are bonded to opposing external drain busses 14-19 surfaces 42,44, opposing the width dimension 58 of conduit 52, such as to be opposed to concave curved segments 62. Employing opposing external surfaces 42,44 of drain busses 14-19 for the mounting of devices 36 provides maximum efficiency in that all concave curved surface 62 segments oppose a device 36 for cooling. Thus, half the length, and therefore half the pressure drop, is required for a given number of devices.

Subcooled nucleate boiling heat transfer at high heat fluxes is inherently more efficient from a curved surface, where the heat flux removed $q \sim v$ where v is the coolant velocity, as compared to a linear surface cooling where the heat flux removed $q \sim (v)^{\frac{1}{2}}$. In curved surface cooling the centrifugal force generated by coolant flow over concave curved heat exchange surfaces provides significant and beneficial buoyancy forces which enhance heat transfer.

Coolant input manifold 66 and discharge coolant manifold 68, are constructed of an electrical insulating material such as ceramic or plastic to provide the needed electrical isolation of drain busses 14-19. Dielectric coolants employed, e.g. fluorocarbons, also provide needed electrical insulation, e.g. 38 KV/0.1" for 3M fluorocarbons. Coolant flow 70 is shown entering input manifold 66 and then with suitable flow diverting means 72 is caused to smoothly flow with minimum undesirable flow characteristics, such as cavitation, vortex shedding etc. into conduits 52 of drain busses 14-19. Upon alternately passing over concave curved surfaces 62 opposing devices 36 mounted on external surfaces 42,44 of drain busses 14-19, the heated coolant 70 discharges out manifold 68 to a heat exchanger and pump which is part of a closed loop cooling system (not shown), preferably closed loop.

FIG. 3 illustrates the output legs 74, 76, 78 of the three phase electrical system. Each leg is connected to the corresponding source buss, i.e. leg 74 to source busses 20, 21 to leg 76 to source buss 22, 23, leg 78 to source buss 24, 25. Source bond leads 80 connect source pads 82 of devices 36 to source busses 20-25. As shown in FIGS. 2, 3, and 5, gate leads 84 connect gate pads 86 on devices 36 to gate lines 30-35. Insulation 90 mounts gate lines 30-35 to drain busses 14-19 and provides electrical isolation.

FIG. 4 illustrates how the supply voltages may be applied to drain buses 14-19. Buss 26, which may be positive (+) is attached to drain busses 14, 16, 18 by connections 28. Buss 27 which would then be negative (−) is connected to drain busses 15, 17, 19 by connections 29.

Figure 1:
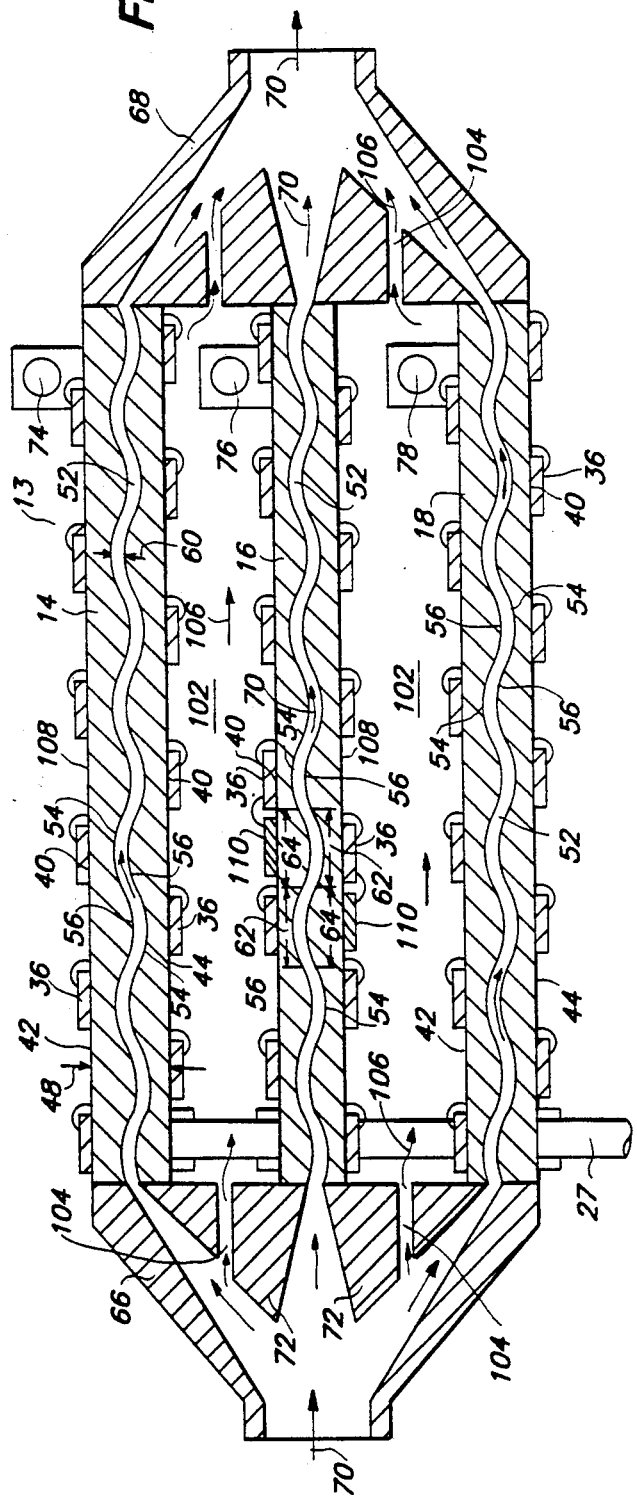
FIG. 1 is a cross section view of a three phase inverter employing MOSFETS illustrating the separate source buss, drain buss and gate line for generating each phase used for MOSFETS.

Devices 36 on each of drain busses 15-20 operate in parallel. Referring now to FIGS. 1 and 2, each drain buss 15-20 is seen as having 12 devices 36, 6 each mounted on opposing surfaces 42,44. If each device 36 is rated at 20 A, then each buss 15-20 will be rated at 240 A inasmuch as devices 36 are connected to a common electrical conductor, i.e. the drain busses. Source buss 20, 21 is driven positive by positive drain buss 14 through positive source lead 80 when gate 86 of line 30 is turned on through gate lead 84 by an appropriate signal from gate line 30. Gates 86 of devices 36 on drain buss 15 are biased off. When the positive wave form returns to zero, gates 84 of devices 36 on drain buss 15 are turned on driving source buss 20, 21 negative while gates 84 of devices 36 on buss 14 are turned off. Thus, one phase of the AC waveform of appropriate frequency is generated. The remaining two phases, from source busses 22, 23 and 24, 25 are generated in the same manner except at differing phase angles to generate the three phase waveform.

The foregoing description of a three phase inverter is for illustration purposes. A single phase inverter would consist of one set of elements comprising drain busses 14, 15 source busses 20, 21 and gate lines 30, 31.

In an N phase inverter, there would be N sets of drain busses and associated circuit components. For other types of systems, e.g. regulators, converters, relay drivers etc., the voltage connections and electrical control arrangements might differ from those shown, however, the constant factor is an elongated electrically isolated metallic structure, here described as the drain buss, having within it a sinuous coolant conduit and there being semi-conductor devices mounted on two of the exterior surfaces of the structure opposing the concave curved surfaces of the conduit.

In general, the drain busses, source busses and gate lines are linear in the length dimension 50. However, it may be desirable to curve the busses and drain to, for example, fit a power supply to the curved surface of a large sychonous motor for compactness and ruggedness.

Figure 6:
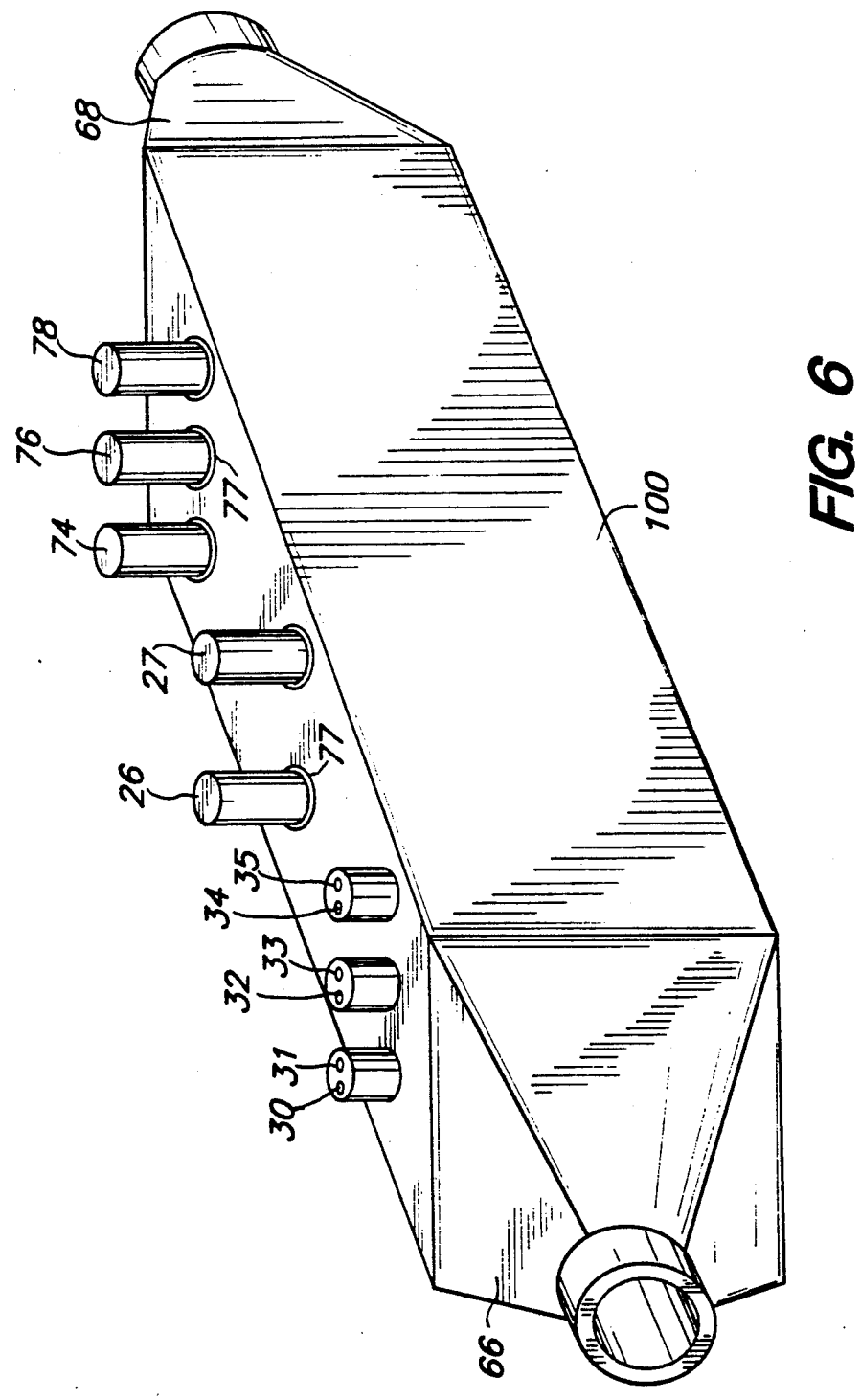
FIG. 6 is a perspective view of an assembled three phase inverter contained in a hermetically sealed housing.

In general, source busses 20, 21 are tied electrically together as are 22, 23, and 24, 25 as shown in FIG. 3. FIG. 5 illustrates source busses 20 and 21, 22 and 23, 24 and 25 combined with walls 92, 94 to form an enclosure containing conduit 96 for the flow of coolant. Conduit 96 is attached to input 66 and discharge 68 manifolds to provide for the flow of coolant 70 for heat removal through conduit 96. When generating high frequency signals, the penetration depth of the current into the conductor decreases with increasing frequency. This higher current density rapidly increases resistive losses. The higher the frequency, the thinner the required wall thickness 98 of the hollow source busses, FIG. 6 illustrates the three phase inverter of FIGS. 1 and 2 enclosed in housing 100. Housing 100 may be made of metal of suitable wall thickness to provide needed strength and rigidity, and may provide a hermetically sealed enclosure. Housing 100 may also provide RFI and/or EMI shielding. Alternately, the entire structure may be encapsulated in a suitable plastic material thereby providing lowest cost, and high strength and rigidity. Electrical feed throughs are provided through housing 100. The three phase AC output is through buss bars 74, 76, and 78. The positive (+) and negative (−) input voltages are shown in buss bars 26 and 27. Insulators 77 which may be ceramic, glass, plastic etc. provide electrical insulation between housing 100 and electrical feed through 74, 76, 78, 26, and 27. Positive 30, 32, 34 and negative 31, 33, 35 gate drive inputs are provided for each phase.

The present description describes the use of a single type of power drive, i.e. MOSFETs, in a power conditioning application. However, different types of power devices may be included either on the same busses or independent busses to provide for more complex designs for example, busses 14, 15 could be employed for diode rectification of incoming line AC. Busses 16, 17 with suitable devices could provide complex power conditioning which in turn drive busses 18, 19 containing larger power output devices. Thus a complete high power supply providing, for example, regulated DC or variable frequency AC output can be contained in the small enclosure of FIG. 6. With hermetic housing 100 in place, the unfilled space 102 (FIG. 1) enclosed by housing 100 may be occupied with air, inert gases, a stationary liquid, e.g. a fluorocarbon coolant, or a flowing coolant. To provide a flow of coolant through space 102, input manifold 66 (FIG. 1) is prepared with conduits 104 which divert a predetermined percentage, e.g. 10%, of the coolant 70 to flow into space 102 enclosed by housing 100. The diverted coolant 106 flows external to and surrounds drain busses 14–19 and serves to provide low level cooling to source busses 20–25, the lead bonds attached to each of devices 36 and gate lines 30–35. Upon reaching discharge manifold 68, coolant 106 discharges though conduits 104 to join the main flow of discharge coolant 70. In general, the coolant flowing into space 102 should preferably be a dielectric that is compatible with bare chip construction, e.g. fluorocarbons. Water or water combinations of coolants are, in general, not desirable for use in contact with bare chips.

Again referring to FIG. 1, external drain buss surfaces 108 opposing convex 56 curved surface segments 64 of buss drains 14–19 do not have devices 36 mounted thereon because the heat transfer characteristics of convex curved surfaces are substantially poorer than concave curved surfaces 54. However, this unused surface 108 may have mounted thereon low power dissipation devices 110 such as driver chips, load resistors etc. Which are connected to devices 36. For example, experiments have demonstrated in excess of 300 W/cm$^2$ dissipation with concave 54 curved surface flow. Even with a ten-fold reduction in power dissipation to 30 W/cm$^2$ over convex curved surfaces 56, this is adequate for most ancillary devices such driver chips 110 which provide additional control for devices 36. Thus, higher packing densities, efficient cooling and lowered operating pressures are obtained.

Lead bonds 80, 84 to power devices 36 are generally of aluminum and may be 0.005" or 0.010" in diameter. Under condition of shock and vibration, especially orthogonal to the axis of the lead bond wire, breakage at the bonding joints can occur. FIG. 7 illustrates lead bond construction that is more rugged than conventional wire lead bond construction. Source buss 20 is extended beyond drain buss 14, in both directions, and is folded over 90° so as to then extend parallel 103 to bare chips 35 and stops just before source bonding pad 82 on chip 36. This extension of source buss 20 may be uniformly applied for the entire length of source buss 20 as shown in FIG. 8. The same basic construction used for the source buss may also be applied to gate line 30. Alternatively, FIG. 9 shows a rigid arm extension 104 from source buss 20, again terminating over source lead bond pad 82 on chip 36. Again referring to FIG. 7, source lead bond 80 which may be wire, e.g. 0.010" aluminum, or tape is bonded to the source pad 82 on devices 36. The key element here is to provide a rigid structure approximately above the various bonding pads of the devices employed. This permits the shortest lead bond with consequent rigidity and strength. The lead wire is then bonded to the source buss at 110 to complete the connection.

The face 112 of source buss 20 is angled 114, e.g. 45°, so as to permit access to surface 112 for bonding by means such as thermocompression or ultrasonic. The spacing 116 between device 36 and source buss 20 is an important consideration in the rigidity of lead bond 80. The shorter the distance 116 the more resistant it is to shock and vibration. For example, spacing 116 may be 0.040" and lead wire 80 may be 0.010" diameter thus providing a rigid structure. Alternatively, a tape 114, e.g. 0.005×0.040" aluminum may be used to provide even better rigidity and multiple bond points for high reliability. The same lead bond construction as used for the source buss 20 is employed for the gate line 30.

FIG. 10 illustrates additional control functions being added to gate line 30. Gate line 30 has lead bond extension arm 105 for rigidity, in the same manner as extension arm 104 as shown in FIG. 9 for the source buss 20. An additional control line 102 is attached to gate line 30 by insulator 106. Lead bond extension arm 107 provides for lead bond 114 to connect device 36 to control line 20.

To enhance heat transfer at concave curved heat exchange surfaces 54, extended surface techniques such as fins 118 (FIG. 11) may be employed. However, for curved surface use, conventional rectangular fin structures 131 (FIG. 11) are not necessarily optimum. In a plane orthogonal to the coolant flow 70, (FIG. 3) are shown fins 118 of generally triangular cross section 119 and of half angle 120, height 122 and pitch 124. The smaller angle 120 is the greater the effective increase in heat exchange area. Buoyancy force 126 due to centrifugal force $a=v^2/r$ may be broken into component 128 parallel to wall 130 and component 132 perpendicular to wall 130. Force 132 drives the bubbles directly away from wall 130 and is proportional to the sine of angle 120. Thus, there is an optimum angle 120 as well as height 122 which balances the increase in heat exchange surface area with nucleate bubble dynamics thereby providing maximum heat flux. In general the tips 134 of triangles 118 are not pointed, but may be flat, rounded, etc.

A further desirable embodiment in extended surfaces for curved surface cooling employs curved fin 118 surfaces 136. Alternatively, a fin with a combination of linear and curved surfaces or multiple linear segments may be employed. Curved fin surfaces 136 permit an optimum fin thickness profile to be specified, matching it to decreasing heat flow as the tip of the fin 134 is approached. In general, fins will have height, width, pitch and spacings ranging from 0.1 mm to 3 mm. For triangular geometries, the effective. half angles will range from 1° to 45°.

FIG. 12. illustrates a cross section view of fins 118 in the direction of coolant flow 7.0. fins extend the length 62 of concave curved heat exchange surface 54 whereas the opposing convex surface 56 is left smooth. Fin transition means 150 such as tapering provide for the smooth transition of coolant flow from one finned surface to the next with minimum undesirable flow characteristics, such as cavitation, etc. It is desirable that the cross section of conduit 52 is maintained substantially constant over the length 50 of drain busses 14-19 containing devices 36 in order to minimize undesirable flow characteristics such as cavitation, etc. Fins may be prepared on the heat exchange surfaces by, for example, mechanically by grinding or chemically by etching, e.g. chemical milling. With etching technique, rectangular fins are obtained without undercutting the photo resist, whereas with triangular or curved fins, controlled undercutting is employed. It may be that for manufacturing convenience as well as for simplifying fin transitions 150, if the additional pressure drop can be tolerated, that fins 118 can be extended the entire length 50 of conduit 52 in drain busses 14-19, extending along concave 54 and convex 56 surfaces.

To further enhance heat transfer from the extended heat transfer surface 130, 136, 28, nucleating sites of optimum geometry and placement may be employed. Heat exchange is enhanced by the preparation of nucleating site cavities 138 on the heat exchange surface 130, 136 that are of optimum dimensions 140, 142 and spacing 144 such that at maximum heat flux the cavities are spaced sufficiently far apart 144 that the nucleate bubbles do not coalesce to form film boiling. Factors affecting bubble size and therefore spacing include surface tension, viscosity, temperature etc. Thus, maximum bubble production is obtained while minimizing the risk of film boiling. Cavity dimensions 140, 142 may range from 0.002 mm to 0.2 mm and spacing 144 between cavities on the heat exchange surface may range from 0.03 mm to 3 mm. This specified geometry of nucleating cavity dimensions and spacing between cavities may be achieved chemically by chemical milling, electronically by lasers, electron beams or electric discharge texturing (EDT) a variant of electric discharge machining (EDM), or mechanically by drilling, hobbing, etc. The inside surfaces of the cavities serving as nucleating sites are preferably further prepared with microcavities 146, preferably reentrant, with dimensions in the range of $10^{-4}$ to $10^{-2}$ mm. Microcavities may be prepared, for example, by laser drilling, electron beam drilling or EDT in the presence of a reactive gas or liquid that creates a porous structure or microcavities in and around the cavities.

A further method to provide nucleating sites on fins is, for example is to employ CVD such that during the deposition process, a specified porosity is achieved for a specified depth. Pore sizes may range from 0.001 mm to 0.1 mm and depth of porosity may range from 0.01 mm to 1 mm. Powder metallurgical technique may also be applied.

The conductive material from which drain busses 14-19, source busses 20-25, and gate lines 30-35 may be constructed include copper, tungsten, molybdenum, beryllium, aluminum, etc.

I claim:
1. A semi-conductor assembly, comprising:
an elongated. electrically isolated metallic support structure of generally rectangular cross section. said structure containing therein an enclosed coolant conduit spanning the length of said support structure, said conduit being of generally rectangular cross-section, the width dimension of said conduit being greater than its height;
a semi-conductor device mounted on at least one exterior surface of said structure, said device being bonded in a thermally intimate manner to said surface of said structure opposing said width dimension of said conduit and being placed opposing a concave curved heat transfer segment of the surface of said conduit;
first circuit means extending along and spaced from said structures, for providing electrical control to said semi-conductor device;
second circuit means, expending along and spaced from said structure, for carrying current from said semi-conductor device; and
electrical interconnect means for connecting said semi-conductor device to said first and second circuit means.
2. The assembly of claim 1, further comprising a plurality of passive electrical devices mounted on said exterior surface of said structure, passive devices being mounted opposing the convex curved surfaces of said conduit and electrically connected to said semi-conductor device.
3. The assembly of claim 1, wherein said coolant conduit comprises a heat exchange surface being concave curved in the direction of coolant flow, said heat exchange surface having fins of at least one of generally triangular and curved cross section, said fins extending in the direction of coolant flow substantially the length of said concave curved heat exchange surface.
4. The apparatus of claim 3 wherein said fins have heights, widths and spacings ranging from 0.1 mm to 3 mm, and effective half angles ranging from 1° to 45°.
5. The apparatus of claim 3 wherein said heat exchange surface is prepared with cavities said cavities having dimensions in the range of 0.002 mm to 0.2 mm, said cavities being spaced apart on said heat exchange surface said spacing generally ranging from 0.03 mm to 3mm whereby more efficient heat transfer is obtained.
6. The apparatus of claim 5 wherein said cavities are prepared with micro-cavities having dimension ranging from $10^{-4}$ to $10^{-2}$ mm.
7. A semi-conductor assembly, comprising:
an elongated electrically conductive support structure having oppositely disposed upper and lower surfaces and an enclosed, substantially sinuous coolant flow path spanning the length thereof intermediate said upper and lower surfaces, said coolant flow path having a first width greater than its height;
a first series of semi-conductor devices spaced apart along the length of said upper surface of said support structure, disposed in intimate thermal contact therewith and electrically connected thereto;
a second series of semi-conductor devices spaced apart along the length of said lower surface of said support structure, disposed in intimate thermal contact therewith and electrically connected thereto; and
means for directing liquid coolant through said coolant flow path to thereby remove thermal energy from said first and second series of semi-conductor devises;

wherein said first and second series of semi-conductor devices each comprise at least one semi-conductor device having a width not exceeding said first width and disposed in a substantially symmetric overlying relationship with said coolant flow path.

8. The assembly of claim 7 wherein each of said first and second series of semi-conductor devices are disposed proximate a concave segment of said coolant flow path.

9. The assembly of claim 7 wherein said coolant flow path is substantially rectangular in cross section.

10. The assembly of claim 7 wherein:
said assembly further comprises an elongated ground bus and an elongated gate bus, each spanning the length of said support structure;
each of said first series of semi-conductor devices comprises a respective supply terminal, a ground terminal, and a gate terminal configured to selectively permit electric current flow from said supply terminal to said ground terminal;
each of said respective supply terminals are electrically connected to said support structure;
each of said respective gate terminals are electrically connected to said gate bus; and
each of said ground terminals are electrically connected to said ground bus.

11. A semi-conductor assembly including first and second semi-conductor devices and a supporting structure, wherein:
said supporting structure is formed of thermally conductive material and includes first and second opposing surfaces, there being a coolant passageway formed in said supporting structure between said first and second opposing surfaces, said coolant passageway being sinuous in shape and manifesting alternating curved approaches to said first and second surfaces;
said first semi-conductor device is disposed on and in thermal contact with said first surface overlying a curved approach by said coolant passageway to said first surface; and
said second semi-conductor device is disposed on and in thermal contact with said second surface overlying a curved approach by said coolant passageway to said second surface.

12. The assembly of claim 1, wherein said coolant flow path is substantially sinuous.

13. The assembly of claim 1, wherein said coolant flow path exhibits a substantially constant cross-section along the length thereof.

14. The assembly of claim 7, wherein said coolant flow path exhibits a substantially constant cross-section along the length thereof.

* * * * *